(12) United States Patent
Kornilovich et al.

(10) Patent No.: US 7,375,012 B2
(45) Date of Patent: May 20, 2008

(54) METHOD OF FORMING MULTILAYER FILM

(76) Inventors: Pavel Kornilovich, 1000 NE. Circle Blvd., Corvallis, OR (US) 97330; Peter Mardilovich, 1000 NE. Circle Blvd., Corvallis, OR (US) 97330; Sriram Ramamoorthi, 1000 NE. Circle Blvd., Corvallis, OR (US) 97330

( * ) Notice: Subject to any disclaimer, the term of this patent is extended or adjusted under 35 U.S.C. 154(b) by 340 days.

(21) Appl. No.: 11/068,363

(22) Filed: Feb. 28, 2005

(65) Prior Publication Data
US 2006/0194420 A1    Aug. 31, 2006

(51) Int. Cl.
*H01L 21/425* (2006.01)
(52) U.S. Cl. .............. 438/531; 438/584; 438/674; 438/694; 438/699; 438/761; 438/FOR. 170; 148/DIG. 26; 216/40
(58) Field of Classification Search ............ 438/531, 438/584, 652, 674, 690, 694, 699, 761, 782, 438/FOR. 170; 216/40; 148/DIG. 26
See application file for complete search history.

(56) References Cited

U.S. PATENT DOCUMENTS

| | | | |
|---|---|---|---|
| 2,744,970 A | 5/1956 | Shockley | |
| 2,939,057 A | 5/1960 | Teszner | |
| 3,964,296 A | 6/1976 | Matzuk | |
| 5,008,616 A | 4/1991 | Lauks et al. | |
| 5,118,801 A | 6/1992 | Lizardi et al. | |
| 5,132,278 A | 7/1992 | Stevens et al. | |
| 5,202,290 A | 4/1993 | Moskovits | |
| 5,237,523 A | 8/1993 | Bonne et al. | |
| 5,330,612 A | 7/1994 | Watanabe | |
| 5,376,755 A | 12/1994 | Negm et al. | |
| 5,418,558 A | 5/1995 | Hock et al. | |
| 5,493,167 A | 2/1996 | Mikol et al. | |
| 5,591,896 A | 1/1997 | Lin | |
| 5,622,825 A | 4/1997 | Law et al. | |
| 5,666,189 A * | 9/1997 | Rostoker et al. | 355/53 |
| 5,747,180 A | 5/1998 | Miller et al. | |
| 5,767,521 A | 6/1998 | Takeno et al. | |
| 5,772,905 A | 6/1998 | Chou | |
| 5,780,710 A | 7/1998 | Murase et al. | |
| 5,801,124 A | 9/1998 | Gamble et al. | |
| 5,837,454 A | 11/1998 | Cozzette et al. | |
| 5,837,466 A | 11/1998 | Lane et al. | |
| 5,843,653 A | 12/1998 | Gold et al. | |
| 5,869,244 A | 2/1999 | Martin et al. | |
| 5,918,110 A | 6/1999 | Abraham-Fuchs et al. | |
| 5,972,710 A | 10/1999 | Weigl et al. | |
| 5,997,958 A | 12/1999 | Sato et al. | |
| 6,034,389 A | 3/2000 | Burns, Jr. et al. | |
| 6,085,413 A | 7/2000 | Klassen et al. | |
| 6,120,844 A | 9/2000 | Chen et al. | |
| 6,150,097 A | 11/2000 | Tyagi et al. | |
| 6,150,106 A | 11/2000 | Martin et al. | |
| 6,214,631 B1 | 4/2001 | Burrows et al. | |
| 6,231,744 B1 | 5/2001 | Ying et al. | |
| 6,238,085 B1 | 5/2001 | Higashi et al. | |

(Continued)

OTHER PUBLICATIONS

International Search Report and Written Opinion of the International Searching Authority dated Jul. 24, 2006.

(Continued)

*Primary Examiner*—Thanh Van Pham

(57) ABSTRACT

This disclosure describes system(s) and/or method(s) enabling contacts for individual nanometer-scale-thickness layers of a multilayer film.

28 Claims, 7 Drawing Sheets

U.S. PATENT DOCUMENTS

| | | | |
|---|---|---|---|
| 6,256,767 B1 | 7/2001 | Kuekes et al. | |
| 6,284,979 B1 | 9/2001 | Malozemoff et al. | |
| 6,294,450 B1 | 9/2001 | Chen et al. | |
| 6,313,905 B1* | 11/2001 | Brugger et al. | 355/55 |
| 6,331,680 B1 | 12/2001 | Klassen et al. | |
| 6,355,436 B1 | 3/2002 | Martin et al. | |
| 6,359,288 B1 | 3/2002 | Ying et al. | |
| 6,360,582 B1 | 3/2002 | Chelvayohan et al. | |
| 6,365,059 B1 | 4/2002 | Pechenik | |
| 6,407,443 B2 | 6/2002 | Chen et al. | |
| 6,438,501 B1 | 8/2002 | Szecsody et al. | |
| 6,463,124 B1 | 10/2002 | Weisman et al. | |
| 6,482,639 B2 | 11/2002 | Snow et al. | |
| 6,521,109 B1 | 2/2003 | Bartic et al. | |
| 6,562,977 B2 | 5/2003 | Karpf et al. | |
| 6,643,491 B2 | 11/2003 | Kinouchi et al. | |
| 6,656,275 B2 | 12/2003 | Iwamoto | |
| 6,680,377 B1 | 1/2004 | Stanton et al. | |
| 6,694,800 B2 | 2/2004 | Weckstrom et al. | |
| 6,747,180 B2 | 6/2004 | Ostgard et al. | |
| 2001/0036721 A1 | 11/2001 | Dallner et al. | |
| 2001/0046009 A1* | 11/2001 | Hatano et al. | 349/86 |
| 2001/0046674 A1 | 11/2001 | Ellington | |
| 2002/0012937 A1 | 1/2002 | Tender | |
| 2002/0061536 A1 | 5/2002 | Martin | |
| 2002/0117659 A1 | 8/2002 | Lieber et al. | |
| 2002/0130353 A1 | 9/2002 | Lieber et al. | |
| 2002/0175408 A1 | 11/2002 | Majumdar et al. | |
| 2003/0089899 A1 | 5/2003 | Lieber et al. | |
| 2003/0121791 A1 | 7/2003 | Cohen | |
| 2003/0132461 A1 | 7/2003 | Roesner et al. | |
| 2003/0148562 A1 | 8/2003 | Luyken et al. | |
| 2003/0170650 A1 | 9/2003 | Karube et al. | |
| 2003/0183008 A1 | 10/2003 | Bang et al. | |
| 2003/0186522 A1 | 10/2003 | Duan et al. | |
| 2003/0189202 A1 | 10/2003 | Li et al. | |
| 2003/0207500 A1* | 11/2003 | Pichler et al. | 438/127 |
| 2003/0219801 A1 | 11/2003 | Lipshutz | |
| 2003/0224436 A1 | 12/2003 | Seiwert | |
| 2004/0005723 A1 | 1/2004 | Empedocies et al. | |
| 2004/0005923 A1 | 1/2004 | Allard | |
| 2004/0007740 A1 | 1/2004 | Abstreiter et al. | |
| 2004/0009510 A1 | 1/2004 | Seiwert | |
| 2004/0028936 A1 | 2/2004 | Kogiso et al. | |
| 2004/0031975 A1 | 2/2004 | Kern et al. | |
| 2004/0043527 A1 | 3/2004 | Bradley et al. | |
| 2004/0061234 A1 | 4/2004 | Shah et al. | |
| 2004/0134772 A1 | 7/2004 | Cohen et al. | |
| 2005/0007323 A1* | 1/2005 | Appelbaum et al. | 345/87 |
| 2005/0034979 A1* | 2/2005 | Druz et al. | 204/298.02 |
| 2005/0066897 A1* | 3/2005 | Pelhos et al. | 118/721 |

OTHER PUBLICATIONS

"Ultrahigh-Density Nanowire Lattices and Circuits" California Nanosystems Institute University of California Sciencexpress Report Sciencexpress/www.sciencexpress.org/13March2003/10$_{13}$ 1126/science 1081940 pp. 1-4.

"Sublighographic nanofabrication technology for nanocatalysts and DNA Chips";J. Vac. Sci. Technol. B21(6) Nov./Dec. 2003;pp. 2951-2955.

"Percolation-dominated conductivity in a conjugated-polymer-carbon composite" Rapid communications Physical Review B vol. 58 No. 12 Sep. 15, 1998 The American Physical Society pp. RR7492-R7495.

"A polymer gate FET sensor array for detecting organic vapours" Sensors and Actuators B 77 Elsevier Science 2001 pp. 155-162.

* cited by examiner

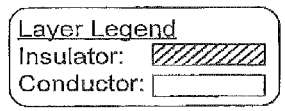
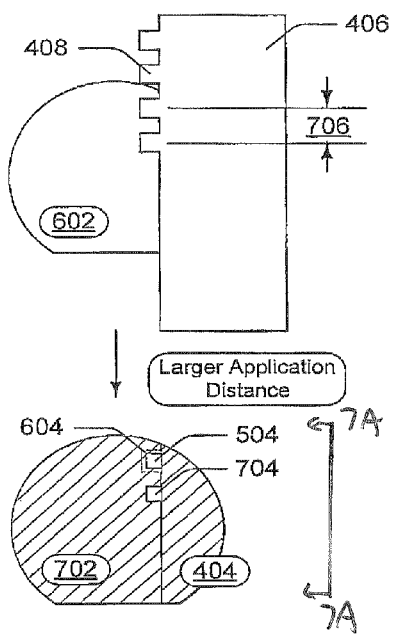
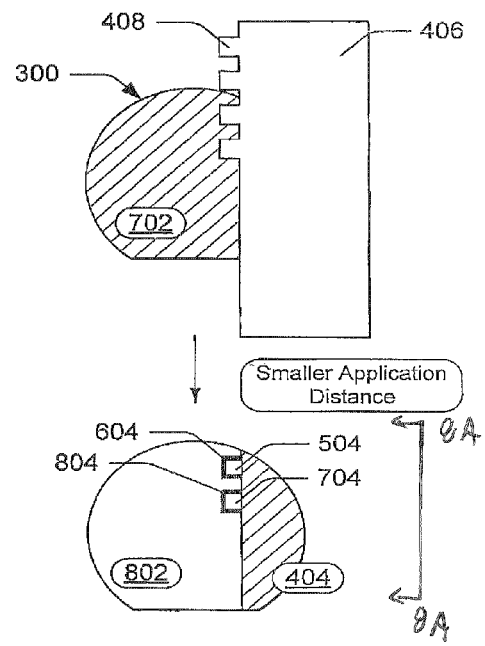
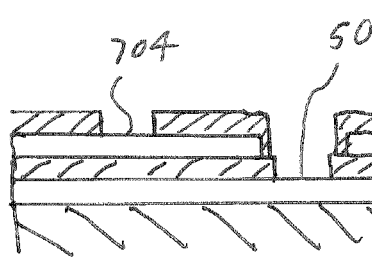
Fig. 7
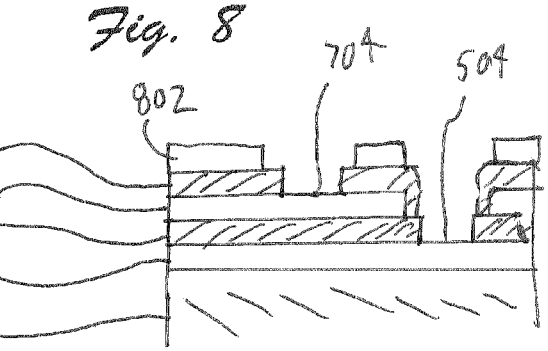
Fig. 8
FIG. 7A
FIG. 8A

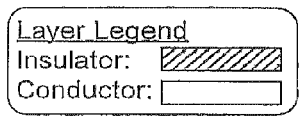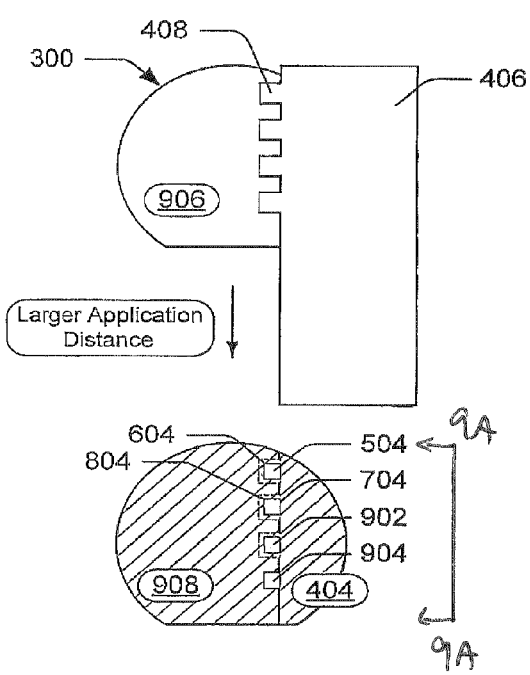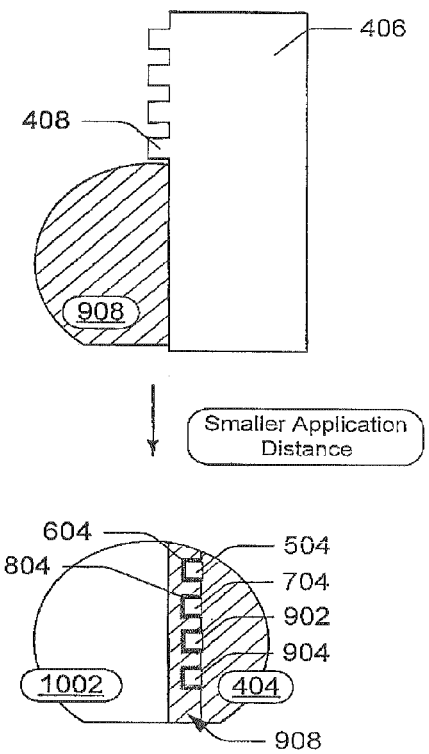
Fig. 9   Fig. 10
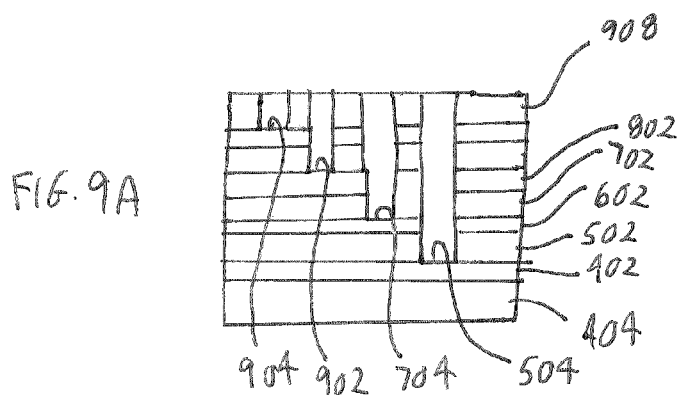
FIG. 9A

METHOD OF FORMING MULTILAYER FILM

TECHNICAL FIELD

This invention relates to contacts for multilayer films.

BACKGROUND

Multilayer films having nanometer-scale-thickness layers (i.e., layers having a thickness between about one to about 100 nanometers) may be used in many advantageous ways. Some of these films have multiple conductive layers separated by insulative layers. To enable some advantageous uses for these types of multilayer films, the multiple conductive layers may be placed in electrical communication. This electrical communication may be to a computer, such as for informational uses like using a multilayer film as a sensor or in a computing system. This electrical communication may also be to a higher-power source, such as for processing of the multilayer film.

One way in which to enable electrical communication with multiple conductive layers of a nanometer-scale-thickness multilayer film is to expose the layers, such as with a cross-section of the multilayer film, and make an electrical contact to the exposed cross-section. This electrical contact, however, may enable electrical communication with multiple—rather than individual—conductive layers. In part because of the thickness of the layers, this way in which to enable electrical communication may be impracticable or impossible to use to enable electrical communication with individual conductive layers.

BRIEF DESCRIPTION OF THE DRAWINGS

FIG. 7 illustrates the substrate of FIG. 6 after further processing.

FIG. 8 illustrates the substrate of FIG. 7 after further processing.

FIG. 9 illustrates the substrate of FIG. 8 after further processing.

FIG. 10 illustrates the substrate of FIG. 9 after further processing.

The same numbers are used throughout the disclosure and figures to reference like components and features.

DETAILED DESCRIPTION

Overview

Figure 1:
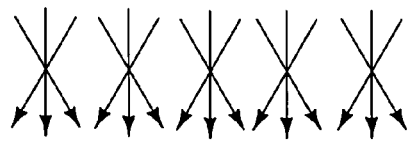
FIG. 1 illustrates a cross-sectional view of a material applied over a surface of a substrate through a mask.
Figure 1:
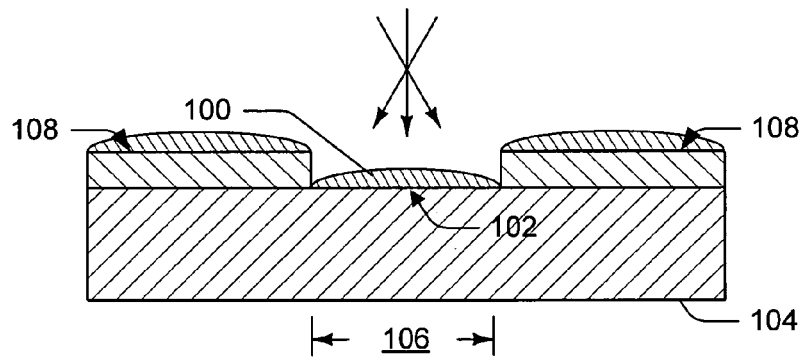

This document describes system(s) and/or method(s) ("tools") enabling large-scale contacts for individual nanometer-scale-thickness layers of a multilayer film.

In one embodiment, the described tools are used to fabricate contacts having exposed dimensions both of which are one or more orders of magnitude larger than a thickness of individual nanometer-scale-thickness layers of a multilayer film to which each enables electrical communication. The described tools also may be used to fabricate, in another embodiment, contacts enabling connection to individual nanometer-scale-thickness layers of a multilayer film where the contacts are separated by at least a micrometer. In still another embodiment, the described tools are used to fabricate large-scale contacts for individual nanometer-scale-thickness layers of a multilayer film using a single mask having one or more protrusions.

Shadow Effect

Often when applying a thin film using a mask, the mask is placed very close to or touching a surface on which the thin film is to be applied. See, for example, FIG. 1. A cross-sectional view of a material 100 applied over a surface 102 of a substrate 104 is shown. Note that the material covers the surface corresponding to the size of an opening 106 of a mask 108. One reason for placing the mask very close to or touching the surface is to reduce a shadow effect.

Figure 2:
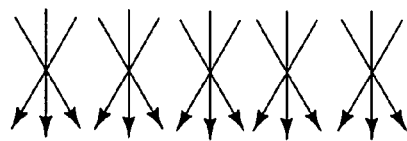
FIG. 2 illustrates a cross-sectional view of a material applied over a surface of a substrate through a mask at an application distance with the applied material demonstrating a shadow effect.
Figure 2:
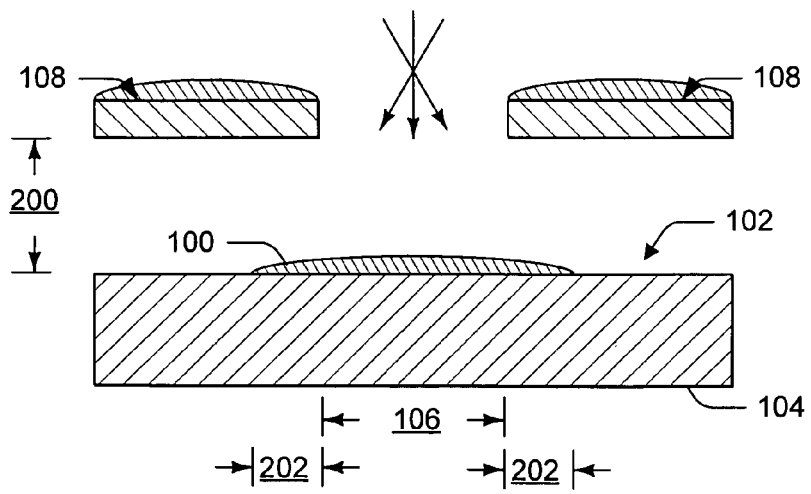

Conversely, consider FIG. 2. Here an exemplary shadow effect is shown. The same mask, material, process of applying the material, and surface shown in FIG. 1 are shown in FIG. 2. The difference is that mask 108 is oriented a distance 200 from surface 102 of the substrate. This application distance is parallel to the direction of application and causes the material to reside outside opening 106 of the mask. The shadow effect, in this example, is the distance 202 outside of the opening 106. The applied material residing outside opening 106 resides on part of surface 102 over which the mask is oriented during application of the material. Thus, the area of surface 102 where the material is not applied may be smaller than the area of the mask.

A shadow effect's magnitude depends on the deposition conditions, such as the material being deposited and how it is deposited. It also depends on the application distance between the mask and the surface on which the material is deposited. Thus, if the deposition conditions are kept constant, the magnitude of the shadow effect may be calculable based on the application distance. The shadow effect's magnitude for particular application distances may also be experimentally determined.

In one experiment, gold was sputtered over a masked $SiO_2$(1.7 μm)/Si substrate having a tantalum adhesion layer on its surface. The tantalum adhesion layer was sputtered on the substrate and not exposed to air prior to applying the gold. The opening in the mask was 150 microns. Without an application distance (the mask touching the tantalum adhesion layer), the gold was deposited to a width of 150 microns—the same as the size of the opening in the mask. With an application distance of 150 microns, the gold was deposited to a width of 240 microns. Thus, the shadow effect's magnitude for this application distance is 45 microns (see, for illustration, distance 202 of FIG. 2). With an even larger application distance of 700 microns, the gold was deposited to a width of 650 microns. The shadow effect's magnitude for this application distance is 250 microns.

Building Large-Scale Contacts

Exemplary ways in which the tools may be used to fabricate large-scale contacts for individual nanometer-scale-thickness layers of a multilayer film are set forth below. In an exemplary illustrated embodiment, the tools use a single mask having one or more protrusions to create these large-scale contacts. In the following illustrated embodiment, the tools orient the mask's position transversely relative to the substrate surface and at varying application distances. These varying application distances can be effective to create a varying shadow effect, which is described below.

Figure 3:
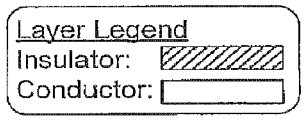
FIG. 3 illustrates an exemplary substrate over which an insulative layer is formed.
Figure 3:
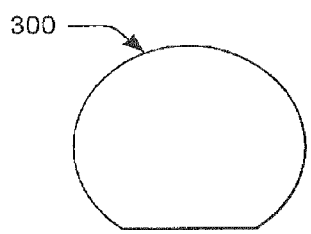
Figure 3:
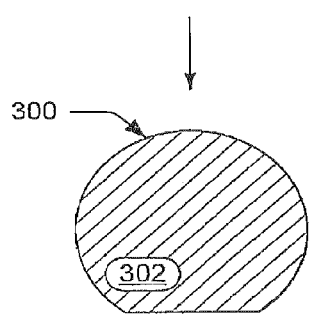

Referring initially to FIG. 3, a plan view of an exemplary substrate 300 is provided over which an insulative layer 302 is formed. This substrate may comprise silicon-based wafers (e.g., Si/SiO$_2$ or Si/Si3N$_4$) with or without preliminary fabricated micron-dimensional support structures. This and other insulative layers described herein may comprise various forms and materials, such as forms with multi-layer insulative layers with one or more materials, such as, for example, oxides, nitrides, and carbides, such as silicon dioxide (SiO$_2$), silicon nitride (Si$_3$N$_4$), aluminum oxide (Al$_2$O$_3$), tantalum pentoxide (Ta$_2$O$_5$), hafnium(IV) oxide (HfO$_2$), zirconium(IV) oxide (ZrO$_2$), strontium titanate (ST), barium strontium titanate (BST), lead zirconium titanate (PZT), strontium bismuth tantalate (SBT), bismuth zirconium titanate (BZT), magnesium oxide (MgO), and yttria-stabilized zirconia (YSZ), and may be nanometer-scale in thickness or otherwise.

Figure 4:
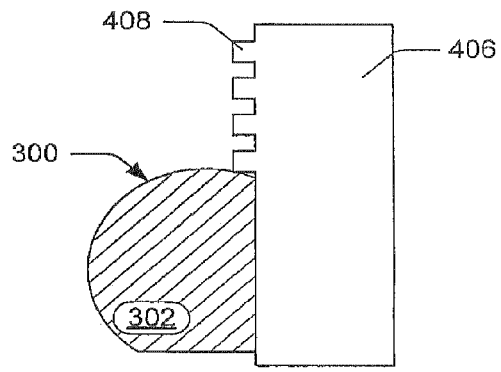
FIG. 4 illustrates the substrate of FIG. 3 after further processing.
Figure 4:
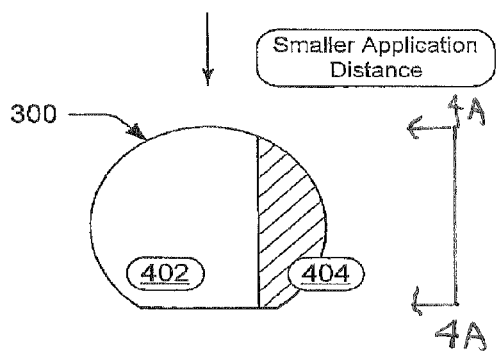
Figure 4A:
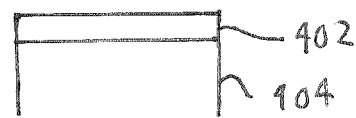

Referring to FIG. 4, a conductive layer 402 is applied over the insulative layer and/or the substrate. This conductive layer may be applied effective to leave an insulative contact region 404 over the substrate, such as with an exposed region of layer 302 formed at FIG. 3. This and other layers may be applied in various appropriate manners, such as by sputtering or photolithography (e.g., deposition of a photoresist, exposure, development, and etching).

In the illustrated embodiment, the conductive layer is applied over the substrate and insulative layer 302 covered in part with a mask 406 with one or more protrusions 408. Here, the mask is effective to prohibit the conductive layer from covering the region 404. Also, the mask may have an application distance or be in contact with the insulative layer.

Figure 5:
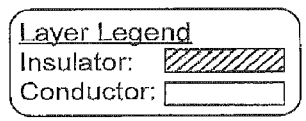
FIG. 5 illustrates the substrate of FIG. 4 after further processing.
Figure 5:
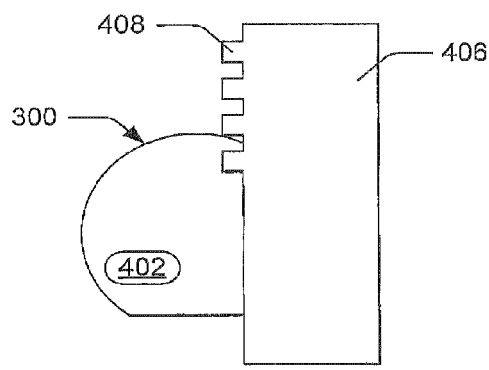
Figure 5:
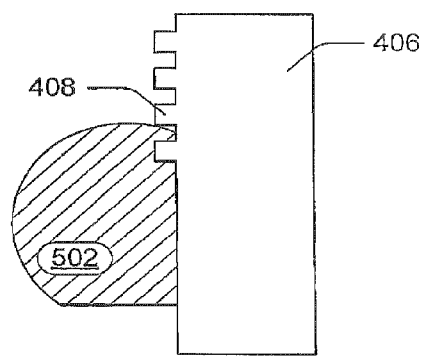
Figure 5:
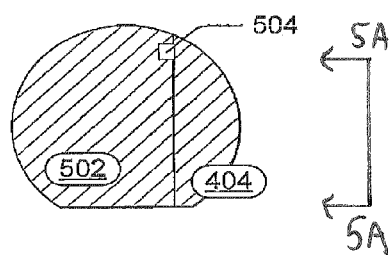

Referring to FIG. 5, a nanometer-scale-thickness insulative layer 502 is applied over conductive layer 402 covered in part by the mask and at least one of the protrusions. The protrusion is effective to prevent the insulative layer from being applied over a contact region 504 of the conductive layer but oriented such that a shadow effect causes the contact region to be smaller in area than the protrusion. The contact region's area is related to the area of the protrusion of the mask and an application distance between the protrusion and the surface of conductive layer 402. The contact region's area may have dimensions that are one or more orders of magnitude larger than the thickness of the conductive layer to which it enables electrical communication. If, for example, the thickness of the conductive layer is twenty nanometers, the outer dimensions (e.g., width and length) of the contact region each may be 500 nanometers to five millimeters.

In the illustrated embodiment, the protrusion of the mask is a square having a width and length of 150 microns, though many other shapes and dimensions may also be used. The protrusion may be a semi-circle, a rectangle, and the like. The dimensions may be nearly arbitrary, such as about 500 nanometers to about five millimeters.

Also in this embodiment, the protrusion of the mask is oriented away from the surface of conductive layer 402 by an application distance of about 150 microns. By so doing, a shadow effect causes the applied insulative layer 502 to cover a greater area than the area of the protrusion (and thus, the contact region has an area smaller than the protrusion). In this case, with the insulative material of insulative layer 502 being Al$_2$O$_3$ and deposited using a sputtering technique, the contact region is about 105 microns in width (shown left-to-right on the page) by about sixty microns in length (shown up-and-down on the page). The shadow effect's magnitude here is about forty-five microns. Thus, the protrusion is 150×150 microns but the contact region is 105×60 microns. This difference may be used to electrically isolate the contact region from later-deposited conductive layers, as will be described below.

Figure 6:
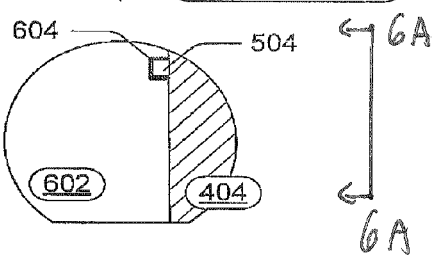
FIG. 6 illustrates the substrate of FIG. 5 after further processing.
Figure 5A:
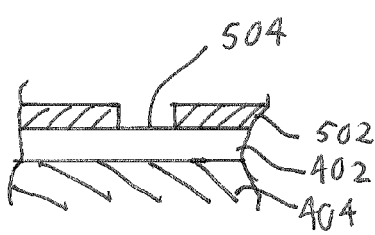
Figure 6A:
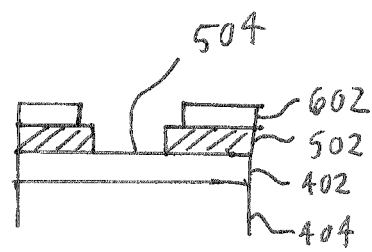

Referring to FIG. 6, a nanometer-scale-thickness conductive layer 602 is applied over insulative layer 502 covered in part by the mask and at least one of the protrusions. This and other nanometer-scale-thickness conductive layers may comprise various materials and in various forms, with materials such as aluminum or gold, and with forms such as multi-layered layers of two or more materials. The protrusion is oriented effective to reduce the magnitude of the shadow effect present in the application of the layer 502 at FIG. 5. By reducing or eliminating the shadow effect, the protrusion may act to prevent the conductive layer 602 from coming into contact with the contact region of conductive layer 402.

In the illustrated embodiment, the protrusion and a zero application distance are effective to prevent the nanometer-scale-thickness conductive layer 602 from coming into contact with contact region 504. The protrusion, being 150×150 microns and with no application distance, is effective to prohibit conductive layer 602 from being applied to an insulative region 604 adjacent the contact region. The insulative region 604 and the contact region 504, with the conductive material of conductive layer 602 being aluminum and deposited using a sputtering technique, is about 150×150 microns. The insulative region 604 provides, on each of the three sides of the contact region 504, an insulative region of about 45 microns. This 45 microns is related to the difference between the contact region's dimensions and the protrusion's dimensions caused by the shadow effect at FIG. 5. The same mask and protrusion may be used in FIGS. 5 and 6.

Referring to FIG. 7, the mask is oriented effective to permit deposition of a nanometer-scale-thickness insulative layer 702 over conductive layer 602 while prohibiting all of contact region 504 to be covered. The mask may also be oriented effective to prevent application of the layer 702 over a second contact region 704 of conductive layer 602. Also, the mask may be oriented at an application distance such that a shadow effect causes the second contact region to be smaller in area than a protrusion of the mask. This shadow effect may be effective to enable coverage of insulative region 604, shown in FIG. 7 with a dashed-line box, with the insulative material of layer 702.

Transverse movement of a mask may be effective to create a pitch or spacing between contact regions. This pitch and spacing may be useful in enabling individual electrical connection to each contact region. The spacing may be nearly arbitrary, from sub-micrometers (e.g., nanometers) to millimeters in magnitude.

In the illustrated embodiment, the mask is moved down the page (transversely relative to the direction of application) and at an application distance (parallel relative to the direction of application). This transverse movement is equivalent to a pitch 706 of protrusions 408 of the mask 406. The application distance may be the same or similar to that previously used, in this case it is also 150 microns. With this exemplary mask, a second protrusion covers contact region 504 and the first protrusion covers second contact region 704. The application distance permits insulative layer 702 to cover at least conductive layer 602 near the insulative region 604, further protecting future electrical connection to the contact region from incidentally connecting to conductive layer 602. The application distance also permits a shadow effect capable of causing the second contact region to be smaller in area than the protrusion. The second contact region's area is related to the area of the protrusion of the mask and the application distance between the protrusion and the surface of conductive layer 602.

Referring to FIG. 8, a nanometer-scale-thickness conductive layer 802 is applied over insulative layer 702 covered in part by the mask and at least two of the protrusions. The protrusions are oriented effective to reduce the magnitude of the shadow effect present in the application of the layer 702 at FIG. 7. By reducing or eliminating the shadow effect, the protrusion may act to prevent the conductive layer 802 from coming into contact with the contact regions 504 and 704.

In the illustrated embodiment, the protrusions and a zero application distance are used, which are effective to prevent the nanometer-scale-thickness conductive layer 802 from coming into contact with contact region 504 and second contact region 704. The protrusions, both being 150×150 microns and with no application distance, are effective to prohibit conductive layer 802 from being applied to the insulative region 604 and a second insulative region 804, which is adjacent the second contact region. The application may be performed similarly as described in relation to FIG. 6. The same mask and protrusion may be used in FIGS. 5, 6, 7, and 8.

In some embodiments, including the illustrated embodiment, the tools may be used to build large-scale contacts as part of a process also used to create the multilayer film. Thus, the large-scale contacts may be built coincident with applying layers with which the multilayer film is built. In the illustrated embodiment, processing of the multilayer film after creation of the film in order to build large-scale contacts is not needed, thereby potentially permitting relatively low fabrication costs. Also in the illustrated embodiment, no non-trivial processing need be used to build a multilayer film with large-scale contacts (outside of use of a mask as set forth herein) than that needed to build the multilayer film without such large-scale contacts.

The tools may be used to continue to build large-scale contacts enabling individual electrical connection to nanometer-scale-thickness layers of a multilayer film, such as by generally repeating the acts described in relation to FIGS. 7 and 8. The tools may do so to create tens, hundreds, or thousands of conductive nanometer-scale-thickness layers and large-scale contacts for individual connection to each.

Referring to FIG. 9, the tools continue to build large-scale contacts, building four contact regions (504, 704, 902, and 904) for four conductive nanometer-scale-thickness layers (402, 602, 802, and 906). The mask can continue to be oriented for creation of additional contact regions oriented along a row, shown like the four contact regions in FIG. 9 (showing also insulative nanometer-scale-thickness layer 908).

The mask may also be oriented to build another row, the first act of which is shown in FIG. 10. Here the mask is oriented leftward (relative to the page), and a fifth conductive layer 1002 is shown applied. Repeating acts similarly to the acts described in relation to FIGS. 4, 5, 6, 7, and 8, the tools may be used to build another row of large-scale contact regions for additional conductive nanometer-scale-thickness layers.

Exemplary Multilayer Films with Large-Scale Contacts

An exemplary system comprising a multilayer film with large-scale contact regions is set forth below. It is provided as but one example of many systems capable of being fabricated using the tools.

Figure 11:
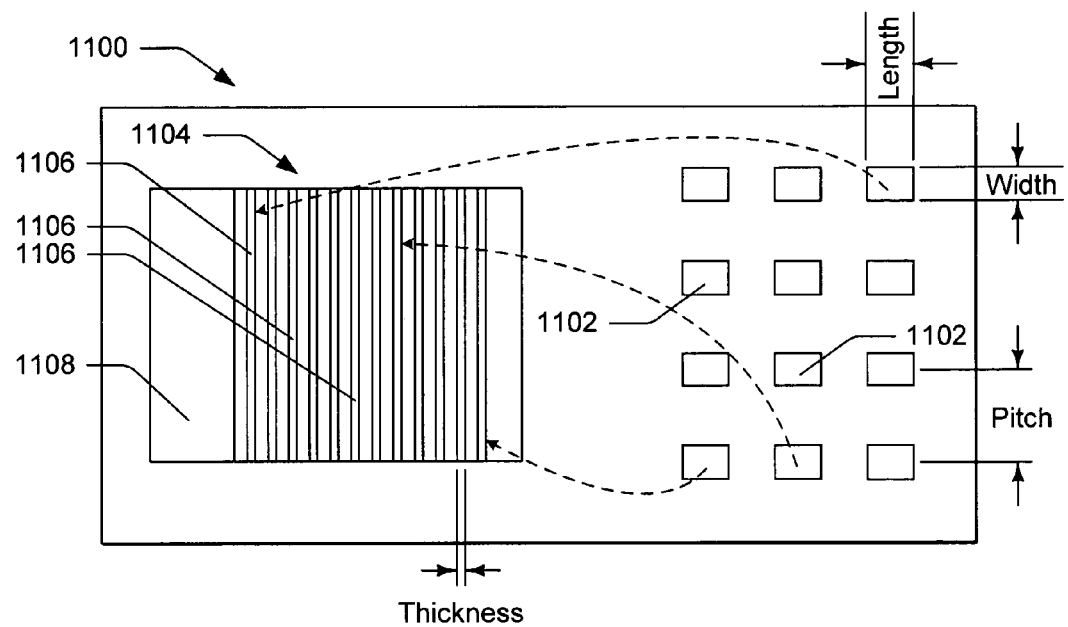
FIG. 11 illustrates an exemplary multilayer film and contact system having exemplary contact regions.

Referring to FIG. 11, an exemplary multilayer film and contact system 1100 is shown with an exemplary plurality of contact regions 1102 along with a cross-section of a multilayer film 1104 showing exposed edges of nanometer-scale-thickness conductive layers 1106. These nanometer-scale-thickness layers may, in some embodiments, correspond to nanometer-scale features, such as conductive structures (e.g., wires).

The system may be created generally as described in the illustrated embodiment for FIGS. 3-10 above, though with substrate 300 having a support structure 1108 to orient the layers. Thus, the tools may be used to deposit twenty-four layers (twelve of them conductive layers 1106) and with three rows of contact regions 1102 enabling individual electrical connection to each of the twelve conductive layers 1106.

Support structure 1108 enables the multilayer film to be applied with a geometry enabling its layers to be exposed in a plane about parallel to that in which the contact regions reside, though this is not necessary. Instead, for example, a cross-section of the substrate 300 and the multilayer film over the substrate (both of FIG. 9) may be cut, thereby creating exposed edges of the multilayer film about perpendicular to the exposed plane of the contact regions. In this system 1100, however, the layers are applied over the structure 1108 and then exposed in a plane about parallel to that of the area of the contact regions.

Figure 12:
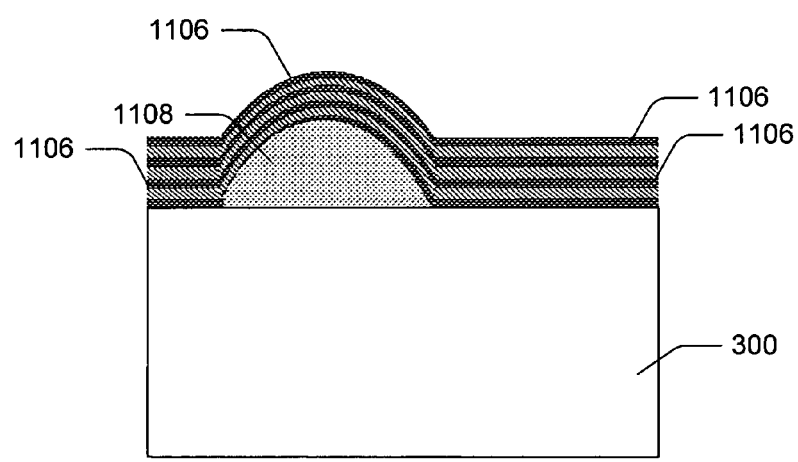
FIG. 12 illustrates a cross-section of three conductive layers applied over a support structure.

FIG. 12 illustrates a cross-section of three conductive layers applied over a support structure. FIG. 12 is provided to show a cross-section of a snap shot in time of layers applied over the support structure 1108 of system 1100. These layers are shown applied prior to applying all twelve conductive layers shown in FIG. 11. These layers are also shown without having been exposed as has been done with conductive layers 1106 of FIG. 11. These layers may later be exposed by various well-known techniques, such as by chemical mechanical polishing or planarization.

Each of contact regions 1102 individually enables electrical communication with one of nanometer-scale-thickness conductive layers 1106 (some communication shown with a dashed-line). In this embodiment, contact regions are shown with a width and length of 60 and 105 microns, respectively, marked at Width and Length in FIG. 11. A Pitch is also marked in FIG. 11, which here is 150 microns. With this width and pitch, a spacing between the contact regions is about 90 microns. The thickness (shown as Thickness in FIG. 11) of the layers 1106 is about twenty nanometers. Thus, each of the pitch, spacing, width, and length of the contact regions is one or more orders of magnitude greater than the thickness of the conductive layers.

Figure 13:
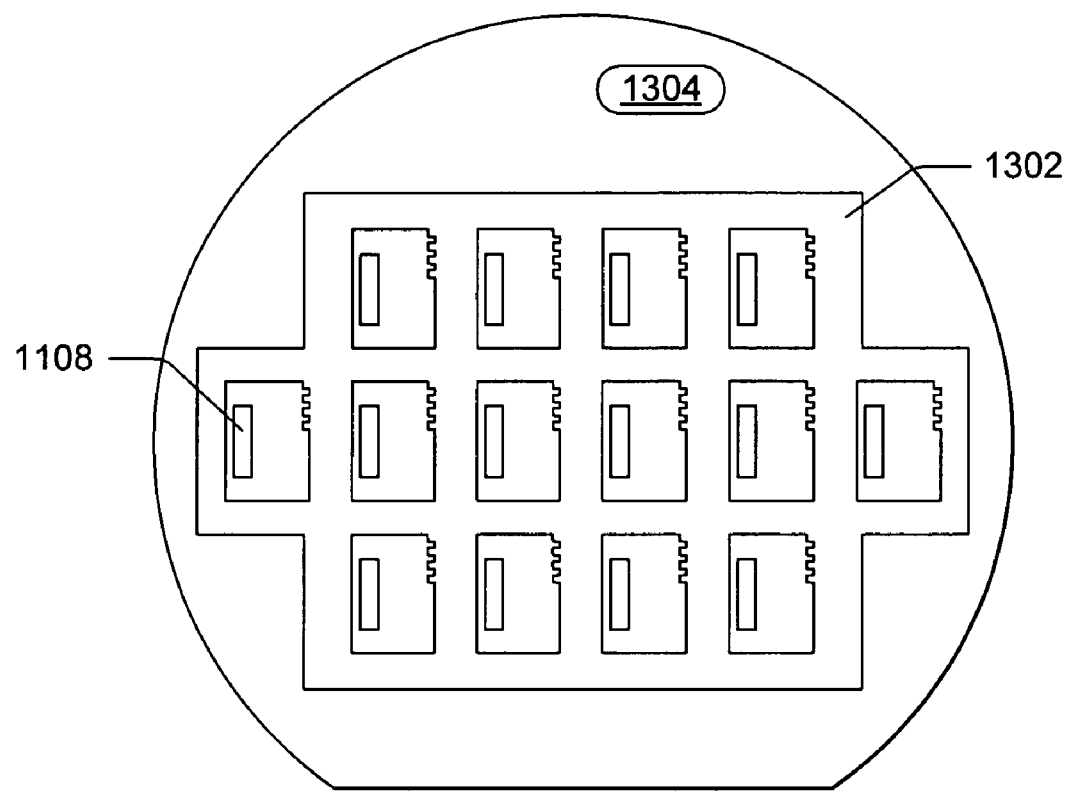
FIG. 13 illustrates an exemplary multi-system mask and substrate.

The tools may also be used to fabricate many nanometer-scale-thickness multilayer films having large-scale contacts for individual nanometer-scale-thickness layers of each film with a mask having protrusions. In FIG. 13, for instance, a multi-system mask 1302 is shown over a substrate 1304 having support structures 1108. By applying layers over substrate 1304, such as according to the acts related to FIGS. 3-10, the tools may be used to fabricate many films with large-scale contacts. As shown in FIG. 13, fourteen multilayer film and contact systems 1100 may be produced with a mask having protrusions for each system.

Although the invention is described in language specific to structural features and methodological steps, it is to be understood that the invention defined in the appended claims is not necessarily limited to the specific features or steps described. Rather, the specific features and steps disclosed represent preferred forms of implementing the claimed invention.

What is claimed is:

1. A method of constructing a multilayer film, comprising:
    applying a second layer of nanometer-scale-thickness over a first layer covered in part by a mask having a first protrusion, the first protrusion effective to prohibit application of the second layer over a first contact region of the first layer and where the first protrusion is oriented a first application distance away from the first contact region so as to permit a shadow effect to occur while the second layer is being applied thereby causing the first contact region to have an area smaller than that of the first protrusion; and
    applying a third layer over the applied second layer while the first protrusion is oriented at a second application distance away from the first contact region, where the second application distance is less than that of the first application distance and prohibits application of the third layer to the first contact region as well as a region of the applied second layer that at least partially surrounds the first contact region.

2. The method of claim 1, wherein the first layer and the third layer are both conductive and the second layer is insulative.

3. The method of claim 1, further comprising, prior to applying the second layer: applying the first layer over an insulative layer covered in part with the mask, the mask effective to leave exposed an insulative region adjacent the first contact after creation of the first contact region.

4. The method of claim 3, wherein the act of applying the first layer over the insulative layer covered in part with the mask comprises orienting the mask substantially without an application distance between the mask and the insulative region.

5. The method of claim 1, wherein the first contact region's area's outer dimensions are both at least about one magnitude greater than the thickness of the first layer.

6. The method of claim 1, wherein the first contact region's area's outer dimensions are about one to about 100 microns.

7. The method of claim 1, wherein the region of the applied second layer that at least partially surrounds the first contact region is effective to insulate the first contact region from the third layer.

8. The method of claim 1, further comprising applying a fourth layer of nanometer-scale-thickness over the third layer covered in part by the first protrusion of the mask, the first protrusion effective to prohibit application of the fourth layer over a second contact region of the third layer and where the first protrusion is oriented a third application distance away from the second contact region so as to permit a shadow effect to occur while the fourth layer is being applied thereby causing the second contact region to have an area smaller than that of the first protrusion.

9. The method of claim 8, further comprising applying a fifth layer over the applied fourth layer while the first protrusion is oriented at a fourth application distance away from the second contact region, where the fourth application distance is less than that of the third application distance and prohibits application of the fifth layer to the second contact region as well as a region of the applied fourth layer that surrounds at least a portion of the second contact region.

10. The method of claim 9, wherein the mask comprises a second protrusion and the act of applying the fifth layer comprises applying the fifth layer over the second protrusion, the second protrusion effective to prohibit the fifth layer from being applied over the first contact region.

11. The method of claim 8, wherein the mask comprises a second protrusion and the act of applying the fourth layer comprises applying the fourth layer over the second protrusion, the second protrusion effective to prohibit the fourth layer from being applied over substantially all of the first contact region.

12. The method of claim 1, further comprising applying additional nanometer-scale-thickness layers using the mask, alternating acts of applying the additional nanometer-scale-thickness layers comprising: altering a prior application distance of the mask; and altering a prior application distance of the mask and a prior transverse location of the mask.

13. A method comprising:
    applying, over an underlying layer, a first nanometer-scale-thickness layer using a mask oriented at a first distance over the underlying layer and a first transverse location transverse to the underlying layer, the mask and its orientation effective to prohibit application of the first nanometer-scale-thickness layer over a portion of the underlying layer;
    applying, over the first nanometer-scale-thickness layer, a second nanometer-scale-thickness layer using the mask oriented at about the first transverse location and a second distance over the underlying layer, the second distance being less than the first distance, the mask and its orientation effective to prohibit contact between the second nanometer-scale-thickness layer and the portion of the underlying layer; and
    applying, over the second nanometer-scale-thickness layer, a third nanometer-scale-thickness layer using the mask oriented at a second transverse location and a third distance over the underlying layer, the third application distance being greater than the second application distance, the mask and its orientation effective to prohibit application of the third nanometer-scale-thickness layer over all of the portion of the underlying layer and over a portion of the second nanometer-scale-thickness layer.

14. The method of claim 13, wherein the mask comprises at least two protrusions, a first protrusion effective to prohibit application of the first nanometer-scale-thickness layer over the portion of the underlying layer and a second protrusion effective to prohibit application of the third nanometer-scale-thickness layer over the portion of the second nanometer-scale-thickness layer.

15. The method of claim 13, wherein the second transverse location is at least about one micron distant from the first transverse location effective to prohibit contact between the portion of the underlying layer and the portion of the second nanometer-scale-thickness layer.

16. The method of claim 13, wherein the underlying layer is conductive, the first nanometer-scale-thickness layer is insulative, the second nanometer-scale-thickness layer is conductive, the portion of the underlying layer comprises a contact region enabling electrical communication with the underlying layer, and the portion of the second nanometerscale-thickness layer comprises a contact region enabling electrical communication with the second nanometer-scale-thickness layer.

17. The method of claim 16, wherein the portion of the underlying layer and the portion of the second nanometer-scale-thickness layer comprise areas, each of the areas having two dimensions both of which are at least about one micron.

18. The method of claim 16, wherein the portion of the underlying layer has an exposed area having two dimensions both of which are at least about an order of magnitude greater than the thickness of the underlying layer.

19. The method of claim 16, wherein the portion of the second nanometer-scale-thickness layer has an exposed area having two dimensions both of which are at least about an order of magnitude greater than the thickness of the second nanometer-scale-thickness layer.

20. The method of claim 13, further comprising applying additional nanometer-scale-thickness layers using the mask, alternating acts of applying the additional nanometer-scale-thickness layers comprising: altering a distance over the underlying layer; and altering a distance over the underlying layer and a transverse location.

21. The method of claim 20, wherein the mask and its orientations are effective to prohibit application of additional nanometer-scale-thickness layers over a portion of at least some of the additional nanometer-scale-thickness layers, each portion electrically isolated from other portions.

22. The method of claim 8, wherein the first contact region and the second contact region are separated by a least 1 micron.

23. A method comprising:
applying a first insulative material onto a first electrically conductive layer to form a second insulative layer through a first opening in a mask opposite a first region of the first layer, the mask being spaced from the first electrically conductive layer by a first distance; and applying a second electrically conductive material onto the second layer to form a third electrically conductive layer through the first opening in the mask opposite the region of the first electrically conductive layer, the mask being spaced from the second layer by a second distance less than the first distance; and applying a second insulative material onto the third electrically conductive layer through the first opening in the mask opposite the first region of the first electrically conductive layer and a second opening in the mask opposite a second region of the first electrically conductive layer, the mask being spaced from the third electrically conductive layer by a third distance greater than the second distance.

24. The method of claim 23, wherein the second layer has a nanometer-scale-thickness.

25. The method of claim 23, wherein the first distance is such that the mask is substantially adjacent the first layer.

26. The method of claim 23, wherein the second distance is such that the mask is substantially adjacent the second layer.

27. A method comprising:
forming a stack of alternating electrically conductive layers and insulative layers by applying different materials through openings of a mask; and adjusting an application distance of the mask to vary an extent to which the layers overlap one another so as to form openings extending into the stack to each electrically conductive layer.

28. The method of claim 27, wherein the multiple layers have a nanometer-scale-thickness.

* * * * *

UNITED STATES PATENT AND TRADEMARK OFFICE
CERTIFICATE OF CORRECTION

PATENT NO. : 7,375,012 B2
APPLICATION NO. : 11/068363
DATED : May 20, 2008
INVENTOR(S) : Pavel Kornilovich et al.

It is certified that error appears in the above-identified patent and that said Letters Patent is hereby corrected as shown below:

On the title page, item (54), in "Title", in column 1, line 1,
delete "METHOD OF FORMING" before "MULTILAYER".

On page 2, item (56), under "U.S. Patent Documents", in column 1,
line 15, delete "6,562,977 B2    5/2003            Karpf et al." and
insert -- 6,562,577        5/2003    Martin et al. --, therefor.

On page 2, item (56), under "U.S. Patent Documents", in column 1,
line 32, below "2003/0148562 A1"
insert -- 2003/0162190    8/2003        Gorenstein David G. --.

On page 2, item (56), under "U.S. Patent Documents", in column 2,
line 6, delete "2003/0224436" and insert -- 2003/0224435 --, therefor.

In column 1, line 1, in "Title", delete "METHOD OF FORMING" before
"MULTILAYER".

Signed and Sealed this

Thirty-first Day of August, 2010

David J. Kappos
*Director of the United States Patent and Trademark Office*